US006603357B1

(12) United States Patent
Higgins et al.

(10) Patent No.: US 6,603,357 B1
(45) Date of Patent: *Aug. 5, 2003

(54) PLANE WAVE RECTANGULAR WAVEGUIDE HIGH IMPEDANCE WALL STRUCTURE AND AMPLIFIER USING SUCH A STRUCTURE

(75) Inventors: John A. Higgins, Westlake Village, CA (US); Moonil Kim, Thousand Oaks, CA (US); Jonathan Bruce Hacker, Thousand Oaks, CA (US)

(73) Assignee: Innovative Technology Licensing, LLC, Thousand Oaks, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/408,992

(22) Filed: Sep. 29, 1999

(51) Int. Cl.[7] .............................. H03F 3/60; H01P 3/12

(52) U.S. Cl. ........................................ 330/286; 333/248

(58) Field of Search ................................ 333/239, 248, 333/251; 330/286

(56) References Cited

U.S. PATENT DOCUMENTS 3,093,805 A * 6/1963 Osifchin et al. ........ 333/238 X
3,543,199 A * 11/1970 Qurne et al. ................ 333/251
3,732,511 A * 5/1973 Den ....................... 333/239 X

FOREIGN PATENT DOCUMENTS

DE 893819 C 10/1953

OTHER PUBLICATIONS

C.M. Liu et al, "Monolithic 40 Ghz 670 mW HBT Grid Amplifier", (1996) *IEEE MTT–S Digest*, p. 1123.

J.A. Higgins, "Development of a Quasi–Optic Power Amplifier for O Band", *A Contract Final Report. Contract F30602–93–C–0188* USAF Rome Laboratory, 26 Electronic Parkway, Griffis AFB NY 13441.

D. Sievenpiper, "High Impededance Electromagnetic Surfaces", (1999) *PhD Thesis , University of California, Los Angeles.*

M.A. Ali, et al., "Analysis and Measurement of Hard Horn Feeds for the Excitation of quasi–Optical Amplifiers" (1998) *IEEE MTT–S*. pp. 1913–1921.

Benet J. A et al; "Spatial Power Combining for Millimeter-wave Solid State Amplifiers" IEEE MTS International Microwave Symposium Digest, US, New York, IEEE, vol. 14, Jun. 1993.

H.M. Barlow et al. : "Slow–Wave Propagation in a Rectangular Waveguide" Proceedings of the Institution of Electrical Engineers., vol 122, No. 12 pp. 1339–1343 (1975).

M. Kim et al.,"A Rectangular the Waveguide with Photonic Crystal Walls for Excitation of Quasi–Optical Amplifiers" IEEE MIT–S International Microwave Symposium Digest, pp. 543–546 (Jun. 1999).

Stevenpiper D et al: "Antennas on High–Impedance Ground Planes" pp. 1245–1248 (1999) IEEE MTTS Digest.

* cited by examiner

*Primary Examiner*—Benny Lee
(74) *Attorney, Agent, or Firm*—Koppel, Jacobs, Patrick & Heybl

(57) ABSTRACT

An improved waveguide wall structure and improved waveguide using the new wall structure as the interior walls of the waveguide. The wall structure comprises a sheet of dielectric material, a series of parallel conductive strips on one side of the dielectric material and a layer of conductive material on the other side. Multiple conductive vias are also included through the dielectric material and between the conductive layer and conductive strips. The new wall structure presents as a series of parallel L-C circuits to a transverse E field at resonant frequency, resulting in a high impedance surface. The wall structure can be used in waveguides that transmit a signal in one polarization or signals that are cross polarized. The new waveguide maintains a near uniform density E field and H field component, resulting in near uniform signal power density across the waveguide cross section.

42 Claims, 8 Drawing Sheets

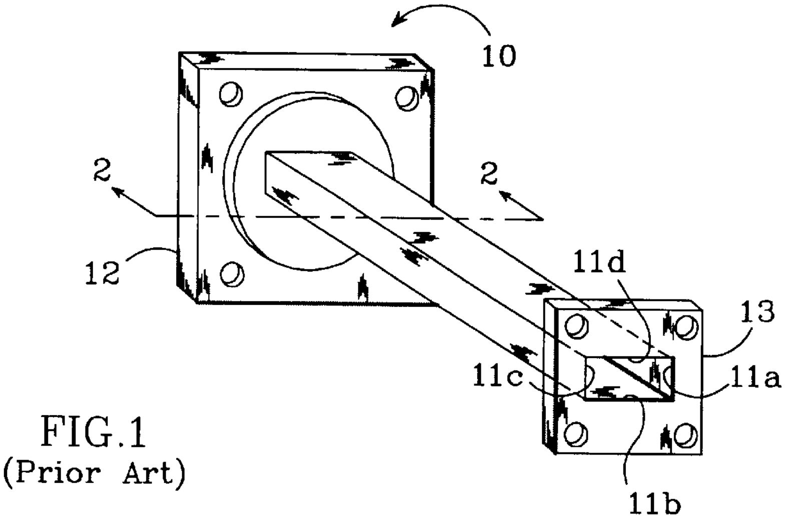
FIG. 1
(Prior Art)
FIG. 2
(Prior Art)
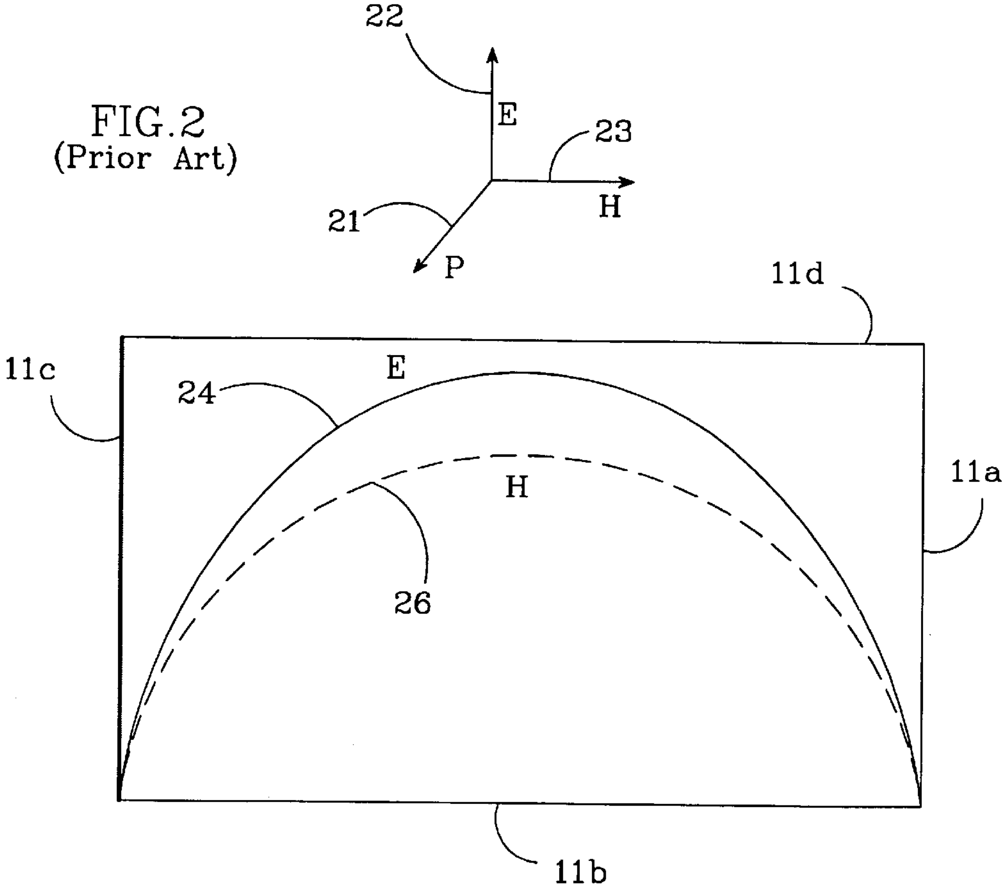

FIG.7a
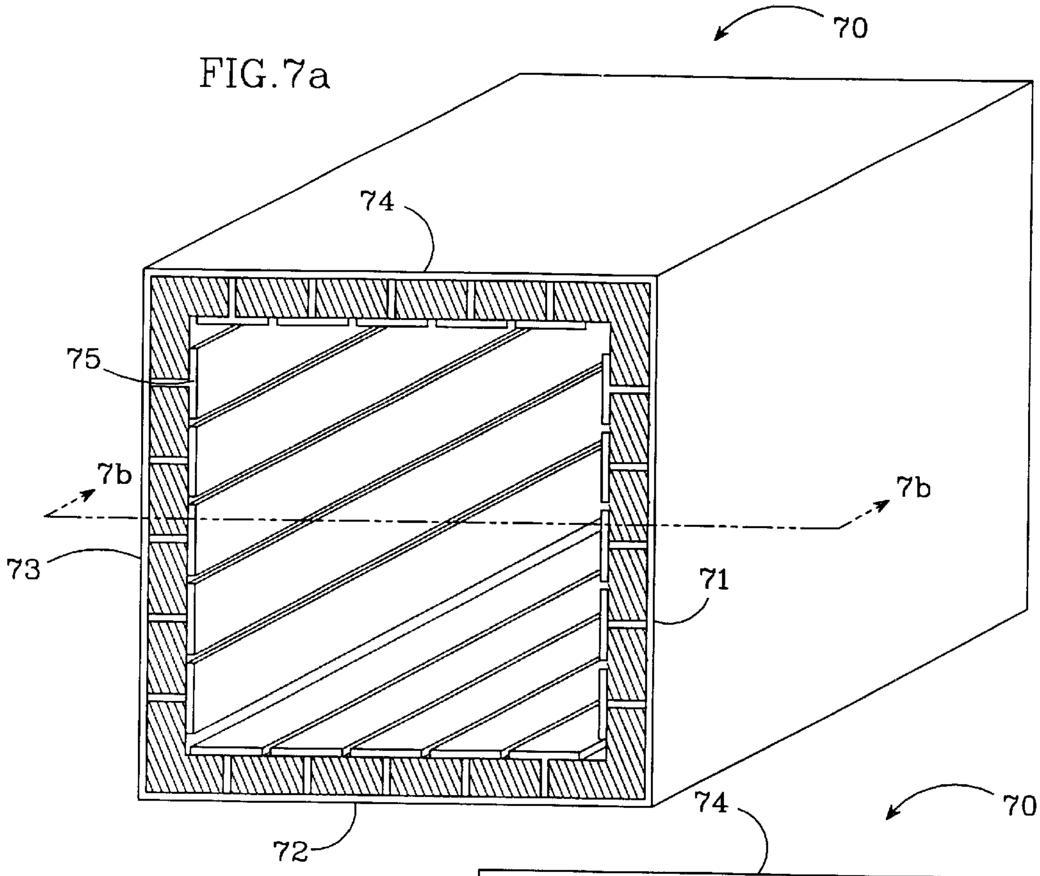
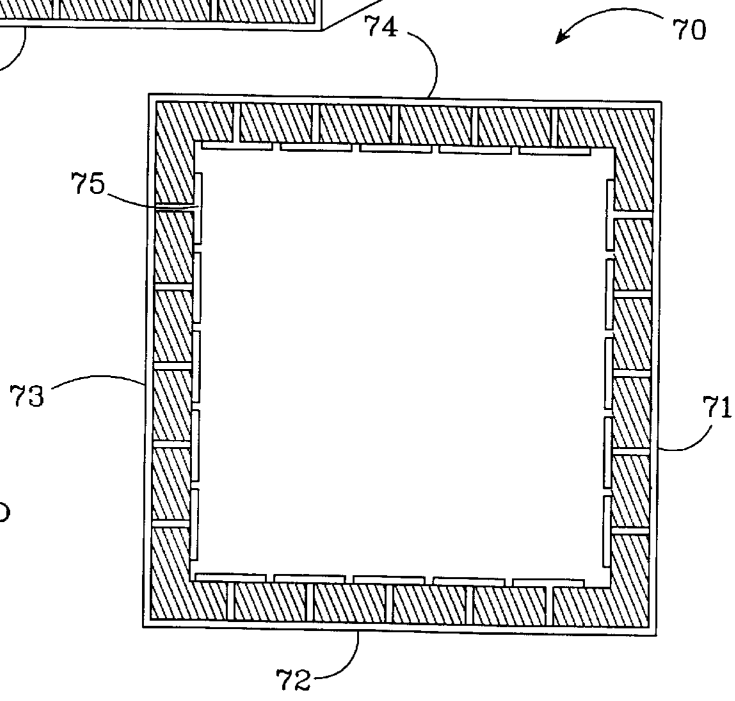
FIG.7b

PLANE WAVE RECTANGULAR WAVEGUIDE HIGH IMPEDANCE WALL STRUCTURE AND AMPLIFIER USING SUCH A STRUCTURE

BACKGROUND OF THE INVENTION

1. Field of the Invention

This invention relates to plane wave rectangular waveguides with high impedance walls.

2. Description of the Related Art

New generations of communications, surveillance and radar equipment require substantial power from solid state amplifiers at frequencies above 30 gigahertz (GHz). Higher frequency signals can carry more information (bandwidth), allow for smaller antennas with very high gain and provide radar with improved resolution. However, amplifying signals with frequencies above 30 GHz using conventional methods does not provide optimal results.

At lower frequencies, available signal power can be increased by adding the output power of two or more amplifiers in a power combining network. For solid state amplifiers, as the frequency of the signal increases the size of the transistors within the amplifier devices decrease. This results in a corresponding reduction in the amplifier power output so that more amplifier devices are required to achieve the necessary power level. For instance, at millimeter wave frequencies the power per amplifier device for a set 10 dB gain ranges from 100 milliwatts (mW) at 30 GHz to 10 mW at 100 GHz. To attain power of more than a watt, at the higher frequencies, hundreds of amplifiers must be combined. This cannot be done by conventional power combining networks because of the insertion loss of the network transmission lines. As the number of amplifiers increases, a point will be reached at which the loss experienced by the transmission lines will exceed the gain produced by the amplifiers.

One method of amplifying high frequency signals is to combine the power output of many small amplifiers in an quasi-optic amplifier array. The amplifiers of the array are oriented in space such that the array can amplify a beam of energy rather than amplifying a signal guided by a transmission line. The amplifier array is referred to as quasi-optic because the dimensions of the array become more than one or two wavelengths. The beam of energy can be guided to the array by some form of a waveguide or the beam can be a Gaussian beam aimed at the array. {C. M. Liu et al, *Monolithic* 40 *Ghz* 670 *mW HBT Grid Amplifier*, (1996) *IEEE MTT-S*, p. 1123}.

Amplifier arrays can be produced as monolithic microwave integrated circuits (MMIC). In MMICs all interconnections and components, both active and passive, are fabricated simultaneously on a semiconductor substrate using conventional deposition and etching processes, thereby eliminating discrete components and wire bond interconnections. Quasi-optical amplifier arrays can combine the output power of hundreds of solid state amplifiers formed in a two-dimensional monolithic array on the plane normal to the input signal.

The primary method for guiding high frequency signals to an array amplifier uses a rectangular waveguide with conductive sidewalls. FIG. 1 shows a conventional metal waveguide 10 having four interior walls 11*a*, 11*b*, 11*c*, 11*d*. A signal source at one end 12 transmits a signal down the waveguide to a quasi-optical amplifier array mounted at the opposite end 13, normal to the waveguide. The numerous small amplifiers of the array amplify the signal and the combination of the amplifiers results in significant amplification of the signal. The E field orientation from the output of the amplifier will be orthogonal to the input E field orientation to reduce oscillatory instability. An output waveguide can be included to guide the output signal to a useful load. Using this method, results have been published showing an ability to reach substantial power at frequencies from 35 to 44 Ghz,{J. A. Higgins, *Development of a Quasi-Optic Power Amplifier for Q Band*, A Contract Final Report. Contract F30602-93-C-0188, USAF Rome Laboratory, 26 Electronic Parkway, Griffis AFB NY 13441.}

However, a rectangular waveguide with conductive sidewalls does not provide an optimal signal to drive an amplifier array. As shown in FIG. 2, a vertically polarized signal 21 has a vertical electric field component(E) 22, a perpendicular magnetic field component(H) 23, and a propagation axis (P). Because the sidewalls 11*a* and 11*c* of the metal waveguide of FIG. 1 are conductive, they present a short circuit to the E field. The E field cannot exist near the conductive sidewall and the power densities of both the E field 24 and the H field 26 drop off closer to the sidewall as shown in FIG. 2. As a result, the power density of the transmission signal 21 varies from a maximum at the middle of the waveguide to zero at the sidewalls 11*a* and 11*c*. If the waveguide cross-section were shaped to support a horizontally oriented signal, the same problem would exist only the signal would drop off near the top wall 11*d* and bottom wall 11*b*.

For an amplifier array to operate efficiently, each individual amplifier in the array must be driven by the same power level, i.e. the power density must be uniform across the array. When amplifying the type of signal provided by the metal waveguide, the amplifiers at the center of the array will be overdriven before the edge amplifiers can be adequately driven. In addition, individual amplifiers in the array will see different source and load impedance depending upon their location in the array. The reduced power amplitude along with impedance mismatches at the input and output make most of the edge amplifiers ineffective. The net result is a significant reduction in the potential output power.

As an example of the power loss in conductive sidewall rectangular waveguide applications, measurements of a 1.2 cm by 1.2 cm array of 112 small amplifiers have provided an output power of 3.0 W at 38 Ghz. If a signal with uniform power density were applied to the same amplifier array the output power would be in excess of 10 W.

A high impedance surface will appear as an open circuit and the E field will not experience the drop-off associated with a conductive surface. A photonic crystal surface structure has been developed which exhibits a high wave impedance over a limited bandwidth. {D. Sievenpiper, *High Impededance Electromagnetic Surfaces*, (1999) PhD Thesis, University of California, Los Angeles}. The surface structure comprises "thumbtacks" of conductive material mounted in a sheet of dielectric material, with the pins of the thumbtacks forming conductive vias through the dielectric material to a continuous conductive layer on the opposite side of the dielectric material. This surface presents a high impedance to an incident EM wave but it has the characteristic of not allowing surface current flow in any direction. The gaps between the thumbtacks present an open circuit to any surface conduction.

Dielectric-loaded waveguides, so called hard-wall horns, have been shown to improve the uniformity of signal power density. {M. A. Ali, et.al., *Analysis and Measurement of Hard Horn Feeds for the Excitation of quasi-Optical Amplifiers*, (1998) *IEEE MTT-S*, pp. 1913–19211}. While an improvement in uniformity, this approach still does not provide optimal performance of an amplifier array in which input and output fields of a signal are cross polarized.

SUMMARY OF THE INVENTION

The present invention provides an improved high impedance surface structure used in waveguides which allows for the transmission of high frequency signals with a near uniform power density across the waveguide cross-section. The new sidewall surface provides a high impedance termination for the E field component of the signal flowing in the waveguide and also allows conduction down the other two walls to support the H field component of the signal. The power wave assumes the characteristics of a plane wave with a transverse electric and magnetic (TEM) instead of a transverse electric (TE) or transverse magnetic (TM) propagation. This transformation of the energy flow in the waveguide provides a wave similar to that of a free-space wave propagation having near uniform power density.

The new wall structure comprises a sheet of dielectric material with a conductive layer on one side. The opposite side of the dielectric material has a series of parallel conductive strips of uniform width, with uniform gaps between adjacent strips. Vias of conductive material are provided through the dielectric material between the conductive layer and the conductive strips. The actual dimensions of the surface structure will depend on the materials used and the signal frequency.

During transmission, the waveguide carries a signal having an E field component transverse to the surface structure's conductive strips. At a resonant frequency the through substrate vias present an inductive reactance (2ΠfL) and the gaps between the strips present an equal capacitive reactance (1/(2ΠfC)). The surface presents parallel resonant L-C circuits to the transverse E field component; i.e. a high impedance. The L-C circuits present an open-circuit to the transverse E-field, allowing it to remain uniform across the waveguide.

Waveguides that transmit a signal in one polarity have the new wall structure on two opposing walls. For instance, a signal wave with a vertical polarity has a vertical E field component. A waveguide with the new surface structure mounted on the sidewalls (with the conductive strips oriented longitudinally) will present an open circuit to the E field at resonant frequency. The top and bottom walls remain conductive, which allows for a uniform H field.

In waveguides that transmit cross-polarized signals (both horizontal and vertical), the new wall structure is used for all four walls. The wall structure will present a high impedance to the transverse E field component of signal in both polarizations. The strips of the new wall structure also allow current to flow down the waveguide, which provides for a uniform H field in both polarizations. Thus, the new waveguide can maintain a cross-polarized signal with uniform density.

These and other further features and advantages of the invention will be apparent to those skilled in the art from the following detailed description, taken together with the accompanying drawings, in which:

BRIEF DESCRIPTION OF THE DRAWINGS

FIG. 1 is a perspective view of a prior art waveguide with metal conductive sidewalls;

FIG. 2 is a cross-section of the waveguide of FIG. 1 taken along section line 2—2 showing the signal power field intensities;

FIG. 7*a* is a perspective view of a new waveguide that supports a signal with vertical and horizontal polarization;

FIG. 7*b* is a cross section of the waveguide in FIG. 7*a* taken along section line 7*b*—7*b;*

DETAILED DESCRIPTION OF THE INVENTION

Figure 3B:
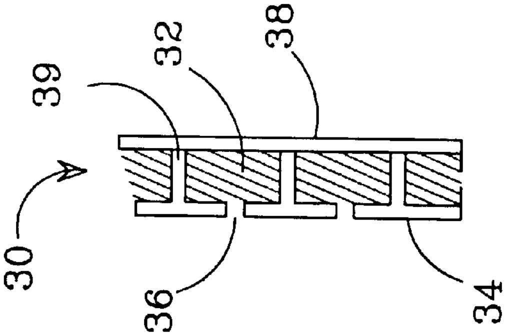
FIG. 3*b* is a cross-section of the new wall structure taken along line 3*b*—3*b;*
Figure 3A:
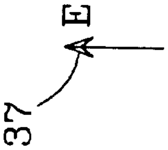
FIG. 3*a* is a plan view of the new waveguide wall structure.
Figure 3A:
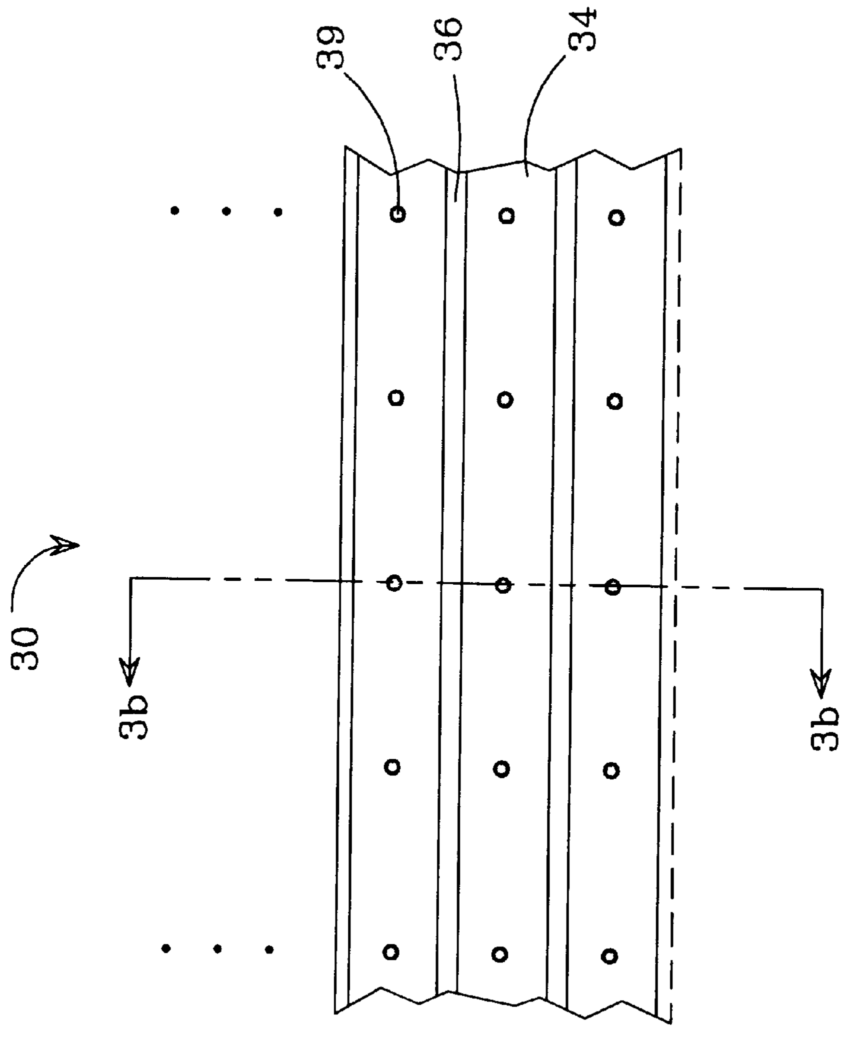

FIGS. 3*a* and 3*b* show one embodiment of the new wall structure 30 having a dielectric material 32 (See FIG. 3*b*) with conductive strips 34 of uniform width on one side, the conductive strips 34 having a uniform gap 36 between adjacent strips 34. A layer of conductive material 38 (See FIG. 3*b*) is included on the side of the dielectric material 32 opposing the conductive strips 34. Vias 39 of conductive material are provided between the conductive strips 34 and the conductive layer 38, through the dielectric material 32. FIG. 3*b* shows a signal with an E field 37 transverse to the conductive strips 34.

The new wall structure is manufactured using known methods and known materials. Numerous materials can be used as the dielectric material 32 including but not limited to plastics, poly-vinyl carbonate (PVC), ceramics, or high resistance semiconductor material such as Gallium Arsenide (GaAs), all of which are commercially available. Highly conductive material must be used for the conductive strips 34, conductive layer 38 and vias 39, and in the preferred embodiment all are gold. Highly conductive materials can also be combined using methods known in the art, such that a combination of highly conductive metals can also be used.

The new wall structure 30 is manufactured by first vaporizing a layer of conductive material on one side of the dielectric material using any one of various known methods such as vaporization plating. Parallel lines of the newly deposited conductive material are etched away using any number of etching processes, such as acid etching or ion mill etching. The etched lines (gaps) are of the same width and equidistance apart, resulting in parallel conductive strips 34 on the dielectric material 32, the strips 34 having uniform width and a uniform gap 36 between adjacent strips.

Holes are created through the dielectric material at uniform intervals, the holes continuing through the dielectric material 32 to the conductive strips 34 on the other side. The holes can be created by various methods, such as conventional wet or dry etching. The holes are then filled or covered with the conductive material and the uncovered side of the dielectric material is covered with a conductive material, both accomplished using sputtered vaporization plating. The holes do not need to be completely filled but the walls of the holes must be covered with the conductive material. The covered or filled holes provide conductive vias 39 between the conductive layer 38 and the conductive strips 34. The dimensions of the dielectric material, the conductor strips and the vias will depend on the frequency of the signal to be transmitted by the waveguide.

A thin layer of titanium can also be deposited on both sides of the dielectric material before deposition of the conductive layers or layer that will form the conductive strips. This is a known method of providing a strong bond between the dielectric material and the conductive material.

Figure 4:
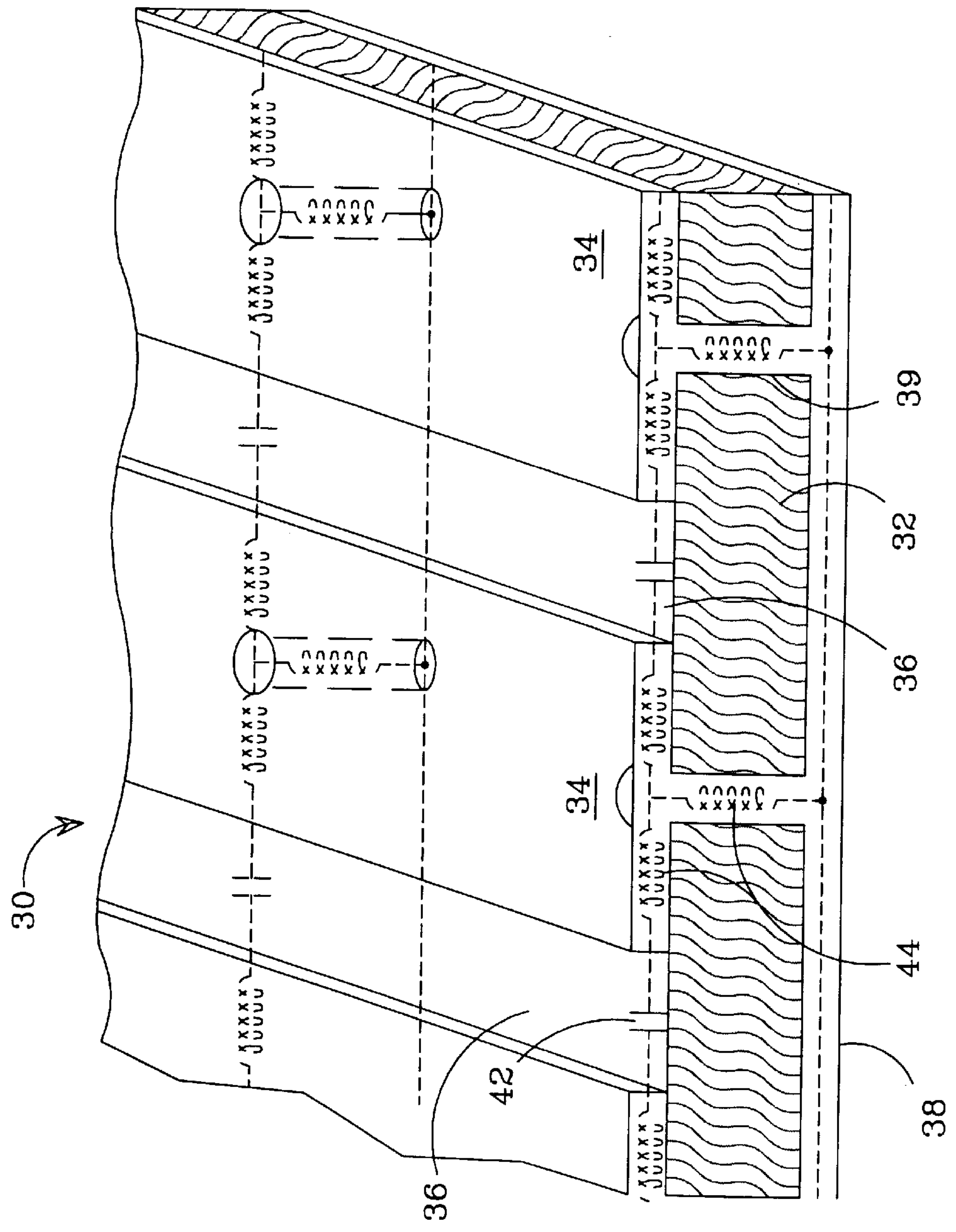
FIG. 4 is a diagram of the L-C circuits presented by the new wall structure.

As shown in FIG. 4, at resonant frequency, the new wall structure 30 presents a capacitance 42 to an E field that is transverse to the conductive strips. The capacitance is primarily dependent upon the width of the gap 36 between the strips 34 but is also impacted by the dielectric constant of the dielectric material 32. The new wall structure 30 also presents an inductance 44 to a transverse E field, the inductance being dependent primarily on the thickness of the dielectric material 32 and the diameter of the vias 39. At resonant frequency, the structure presents parallel resonant L-C circuits and, as a result, a high impedance to a transverse E field. A wave normally incident on this plane will be reflected with a reflection coefficient of +1 at the resonant frequency, as opposed, to a −1 for a conductive material. The wall structure 30 also has a conductive layer 38 similar to the structures of. FIG. 3*b*.

For different frequency waveguides, the dimensions and composition of the wall structure are different. To increase the resonant frequency of the new wall structure, the thickness of the dielectric material 32 can be decreased or the gap 36 between the conductive strips 34 can be increased. Conversely, to decrease the frequency, the thickness of the dielectric material 32 can be increased and the gap 36 between the conductive strips 34 can be decreased. Another contributing factor is the dielectric constant of the dielectric material 32. A higher dielectric constant will increase the capacitance of the gap and lower the resonant frequency.

The new wall structure 30 will present an open impedance at one specific frequency, depending on it's dimension and composition. However, it will also present a high impedance to signals within a limited frequency band, usually within a 10–15% bandwidth. For instance, a wall structure designed for a 35 GHz signal will also present as a high impedance to an approximate 5 GHz signal bandwidth. As the frequency deviates from the specific resonant frequency, the performance of the surface structure 30 and the waveguide degrades. For frequencies far outside the design bandwidth, the new wall structure 30 will simply appear as a conventional metal conductive material and the E field of the signal will drop off closer to the wall structure.

Figure 5:
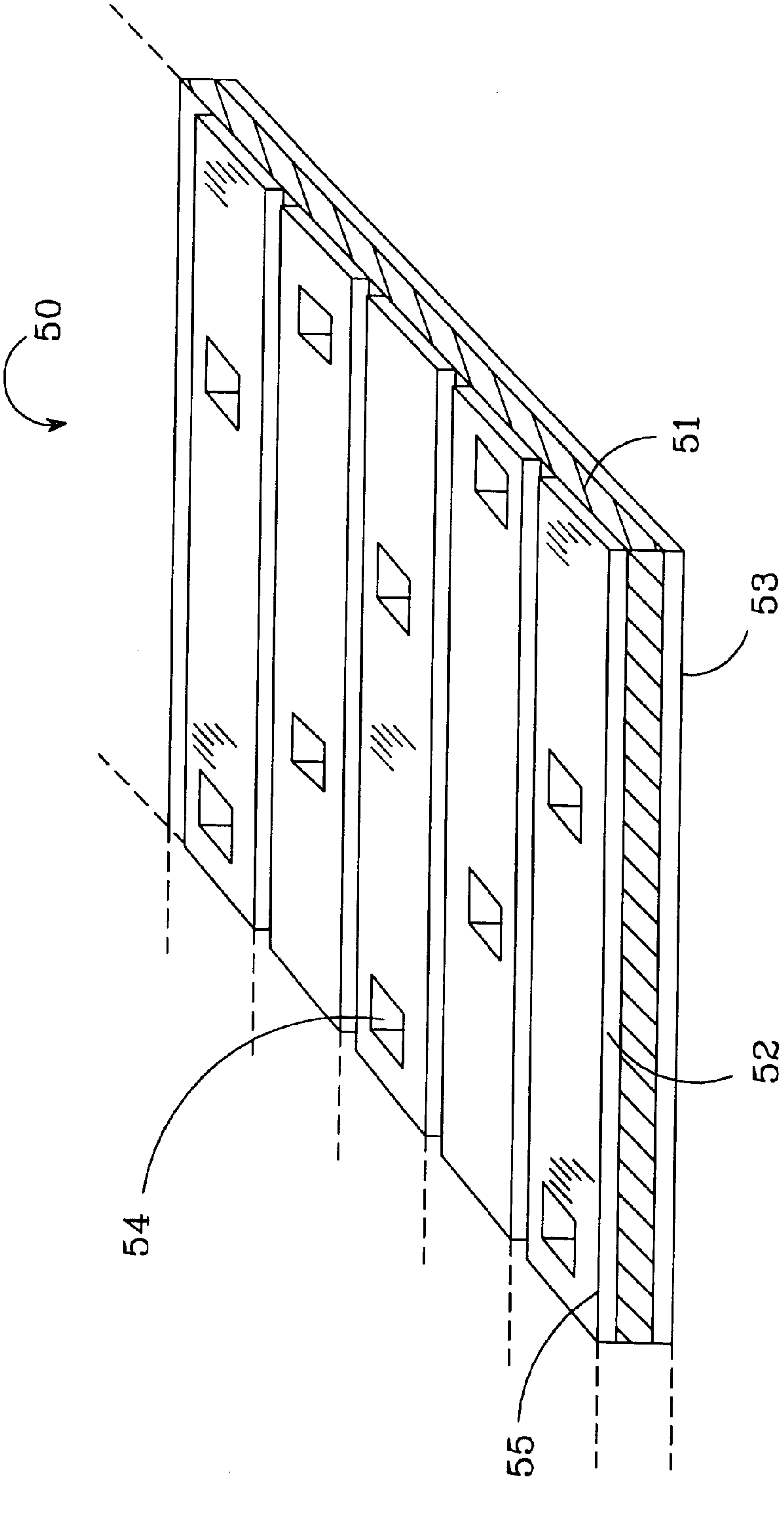
FIG. 5 is a perspective view of the new wall structure.

FIG. 5 shows a preferred embodiment of the new wall structure 50 resonant to a 35 GHz signal. The dielectric material 51 is comprised of the semiconductor material gallium arsenide (GaAs) and is 10 mils thick. The conductive strips 52 can be 1–6 microns thick with the preferred strips being 2 microns thick. The conductive strips 52 are 16 mils wide with a 1.5 mil gap etched between adjacent strips. The conductive layer 53 on the opposite side of the dielectric material 51 can also be 1–6 microns thick. Both the conductive layer 51 and the conductive strips 53 are preferably gold.

Vias 54 having a 5 mil by 5 mil cross section (although circular vias would function the same) are placed down the center of the respective strip, with 35 mils between the center of each adjacent vias on a respective strip. Every other strip has a via created at the same longitudinal point 55 on the strip, while the adjacent strips have vias that start 17.5 mils down the respective strip 56. The vias 54 can be filled with gold or the interior wall of the vias 54 can be covered with gold. In either case, each vias 54 provides a conductive element between the conductive strips 52 and the conductive layer 53.

Wall structures of differing dimensions and materials could be produced pursuant to this invention that would also present a high impedance surface to a 35 GHz signal. For instance, a dielectric material 51 having a different dielectric constant can be used and/or the physical dimensions of the structure can be varied. Accordingly, the wall structures 30 and 50 are not intended to limit the invention to any particular structure or composition.

The wall structure can be affixed to the desired walls of a metal waveguide with the conductive strips surface faced in toward the center of the waveguide and the conductive strips oriented longitudinally down the waveguide. The structure can be affixed using a variety of materials such as silicon glue. Alternatively, the waveguide can be manufactured with the wall structure used as the wall of the waveguide.

Figure 6:
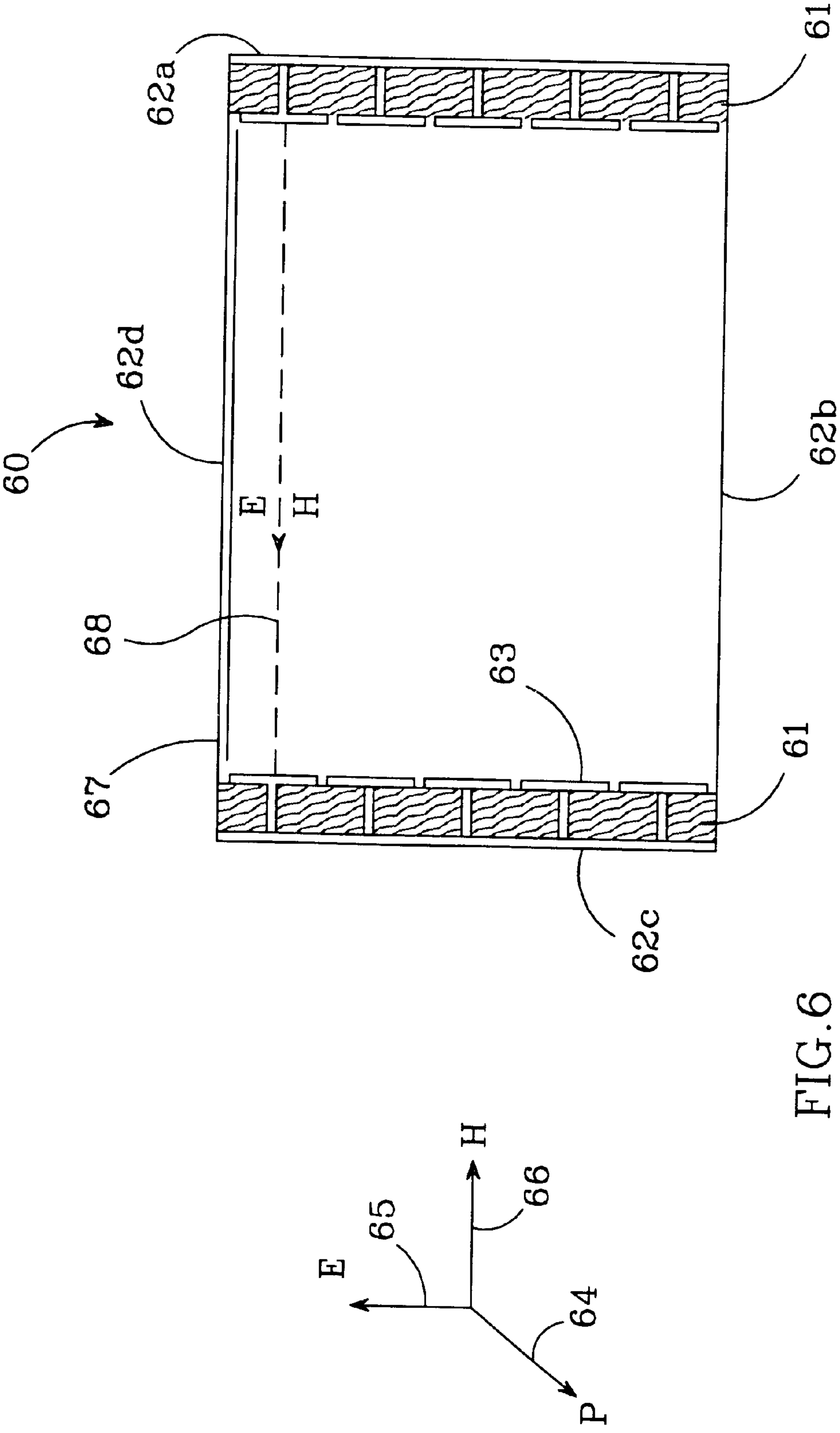
FIG. 6 is a cross-section of a new waveguide with new sidewalls.

The wall structure can be used in waveguides transmitting a signal in one polarization or in waveguides transmitting or supporting a cross polarized signal. FIG. 6 shows a cross section of a new rectangular metal waveguide 60 having the new wall structure 61 on the sidewalls 62*a* and 62*c*. The conductive strips 63 of the wall structure are oriented longitudinally down the waveguide 60. The vertically polarized signal 64 having the propagation axis (P) will have vertical E field component 65 and horizontal H field component 66. The E field will be transverse to the conductive strips 63 and the wall structure will appear as a series of parallel L-C circuits. The E field power density 67 will remain uniform across the waveguide 60. Current will flow into/out of the top wall 62*d* and out of/into the bottom wall 62*b* allowing the H field power density 68 to remain uniform.

FIGS. 7*a* and 7*b* show a hew metal waveguide 70 having the new wall structure used on all four walls 71, 72, 73, 74 with the conductive strips 75 oriented longitudinally down the waveguide. The strip feature of the wall structure allows the waveguide 70 to transmit a signal with horizontal and vertical polarizations while maintaining a uniform power density. The portion of the signal with vertical polarization will have an E field with uniform density as a result of the high impedance presented by the wall structure on the sidewalls 71 and 73. Current will flow down the strips of the wall structure on the top wall 74 and/or bottom wall 72 of the waveguide, maintaining a uniform H field. For the portion of the signal having horizontal polarization, the E field will maintain uniform power density because of the wall structure at the top wall 74 and bottom wall 72, and the H field will remain uniform because of current flowing down the strips of the sidewalls 71 and 73. Thus, the cross polarized signal will be uniform across the waveguide.

Figure 8A:
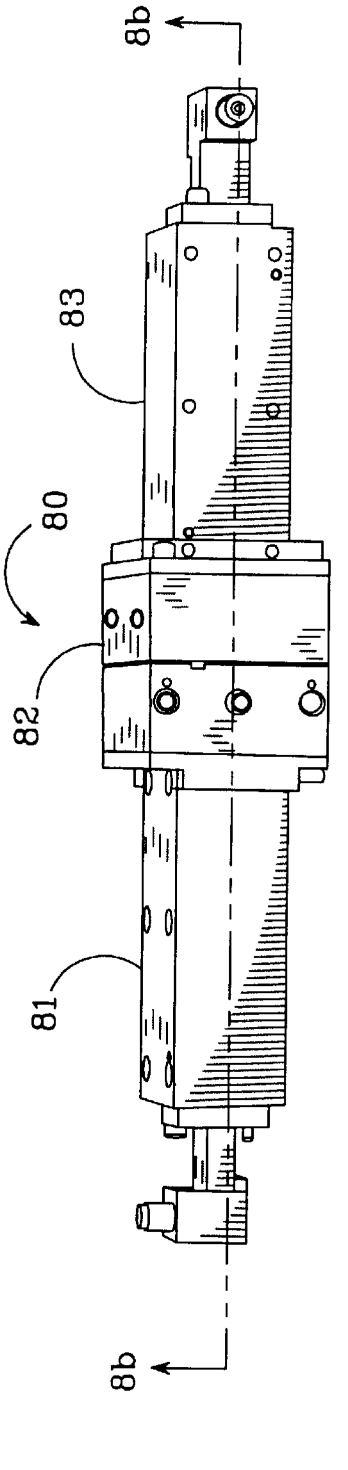
FIG. 8*a* is a perspective view of a new waveguide for transmitting high frequency signals of orthogonal input and output polarization.
Figure 8B:
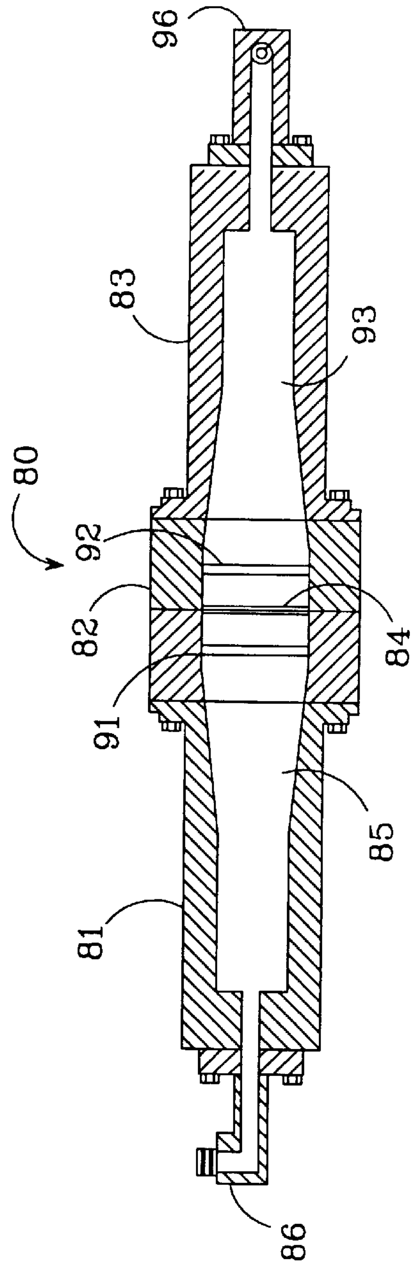
FIG. 8*b* is a cross section of the waveguide in FIG. 8*a* taken along section line 8*b*—8*b;*
Figure 9B:
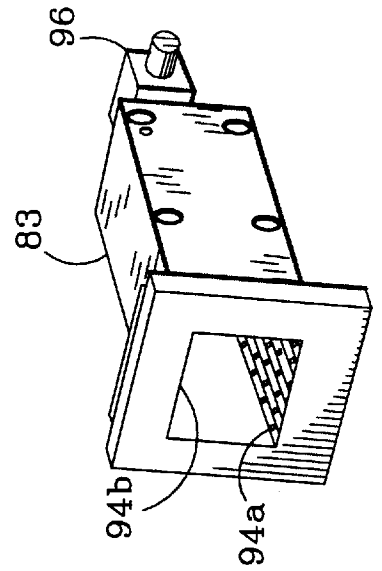
FIGS. 9*a*, 9*b* and 9*c* are perspective views of different sections of the waveguide in FIGS. 8*a* and 8*b*.
Figure 9A:
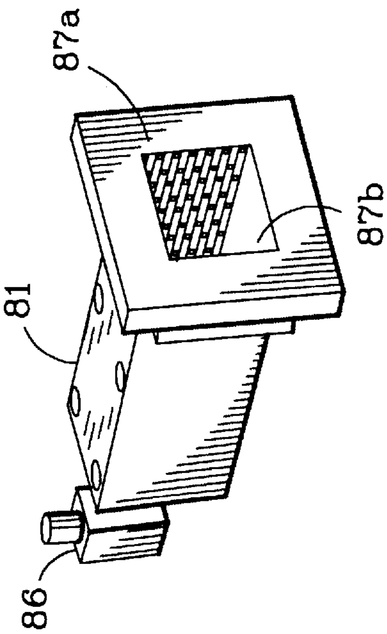
Figure 9C:
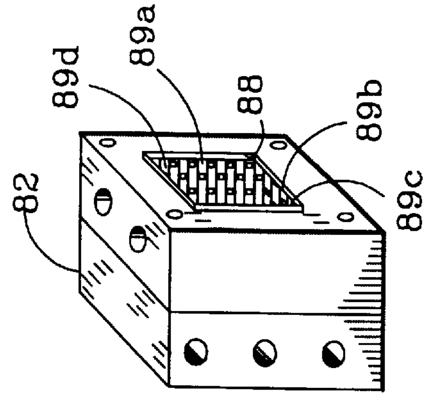

FIGS. 8*a* and 8*b* show a new metal waveguide 80 with the new high impedance wall structure. The waveguide comprises a horn input section 81, an amplifier section 82 and a horn output section 83. FIGS. 9*a* and 9*b* show waveguide sections 81 and 83 that have the wall structure on two walls and FIG. 9*c* shows waveguide section 82 that has the wall structure on four walls. An array amplifier 84 as shown in FIG. 8*b*, is mounted in the amplifier section 82, near the middle.

The amplifier array 84 has a larger area than the cross section of the standard sized high frequency metal waveguide. As a result, the cross section of the signal must be increased from the standard size waveguide to accommodate the area of amplifier array 84 such that all amplifier elements of the array will experience the transmission signal. The input section 81 has a tapered horn guide 85, as shown in FIG. 8*b*, that transforms the size of the beam to accommodate the larger amplifier array 84, while maintaining a single mode signal.

An input signal with vertical polarization enters the waveguide at the input adapter 86, shown in FIGS. 8*b* and 9*a*. As shown in FIG. 9*a*, the new surface structure shown in FIG. 5 is affixed to the sidewalls 87*a* and 87*b* of the input section 81. The polarization of the signal remains vertical throughout the input section 81, and the new surface structure need only be mounted on the sidewalls.

The E field component of the signal in the input section 81 will have a vertical orientation and the H field component will be perpendicular to the E field. In this orientation, the new wall structure will appear as an open circuit to the transverse E field, providing a hardwall boundary condition. In addition, current will flow down the top and/or bottom conductive wall, providing for a uniform H field. The uniform E and H fields provide for a near uniform signal power density across the input section 81 cross section.

As shown in FIG. 9*c*, the amplifier section 82 of the waveguide contains a square waveguide 88 with the wall structure mounted on all four walls 89*a*, 89*b*, 89*c*, 89*d*, to support both a horizontal and vertical polarized signal (cross polarized) Amplifier arrays 84 are generally transmission devices rather than reflection devices, with the signal entering one side of the array amplifier and the amplified signal transmitted out the opposite side. This reduces spurious oscillations that can occur because of feedback or reflection of the amplified signal toward the source. Amplifiers arrays also change polarity of the signal which further reduces spurious oscillations. However, a portion of the input signal will carry through the amplifier array still having the input polarization. In addition, a portion of the output signal will reflect back to the to the waveguide area before the amplifier. Thus, in amplifier section 82 both polarizations will exist.

As described above, the strip feature of the new wall structure allows the amplifier section 82 to support a signal with vertical and horizontal polarization. The wall structure presents high impedance to the transverse E field, of both polarizations, maintaining the E field density across the waveguide for both. The strips allow current to flow down the waveguide in both polarizations, maintaining a uniform H field, density across the waveguide for both. Thus, the cross polarized signal will have uniform density across the waveguide.

Matching grid polarizes 91 and 92, shown in FIG. 8*b*, are mounted on each side of the array amplifier 84, parallel to the array amplifier. The polarizers are devices that appear transparent to one signal polarization while reflecting a signal with an orthogonal polarization. For instance, the output grid polarizer 92 allows a signal with an-output polarization to pass, while reflecting any signal with an input polarization. The input polarizer 91 allows a signal with-an input polarization to pass, while reflecting any signal with an output polarization. The distance of the polarizers from the amplifier can be adjusted, allowing-the polarizers to function as input and output tuners for the amplifier, with the polarizers providing the maximum benefit at a specific distance from the amplifier.

The output grid polarizer 92 reflects any input signal carried through the array amplifier 84. Thus, the signal at the output section 83 will only have the vertical output polarity. Like the input section 81, the output section 83 is also a tapered horn guide 93 as shown in FIG. 8*b*, but is used to reduce the signal cross section of the amplified signal for transmission in a standard high frequency waveguide. As partially shown in FIG. 9*b*, to maintain a uniform density signal in the output section, the structure is mounted on the top wall 94*a* and bottom wall 94*b* of the output section with the strips oriented longitudinally down the waveguide. This allows for the output signal to maintain near uniform power density. The output adaptor 96 shown in FIGS. 8*b* and 9*b*, transmits the amplified signal out of the waveguide.

The output power of an amplifier array can be significantly increased using the new waveguide. The reduction in maximum output power of an amplifier array due to non-uniform field distribution on the waveguide can be quantitatively described by a perimeter called Field Flatness Efficiency (FFE). FFE is the sum of the power deviation from peak value $E_{max}$ integrated over the width of the guide (a), $$FFE=1/a\ {}_0\int^a[E_y(x)/E_{max}]^2dx$$

For a signal transmitted in a conductive wall waveguide, the FFE is only 50% indicating a 3 dB reduction in the maximum output power. The FFE of a the new photonic crystal waveguide is greater than 90% at resonant frequency.

Although the present invention has been described in considerable detail with reference to certain preferred configurations thereof, other versions are possible. The surface structure described can be used in applications other than waveguides. Therefore, the spirit and scope of the appended claims should not be limited to their preferred versions contained therein.

We claim:

1. A waveguide wall, comprising:

a sheet of dielectric material having two sides;

a conductive layer on one side of the two sides of said dielectric material;

a plurality of mutually spaced parallel conductive strips on the other side of the two sides of said dielectric material; and a plurality of conductive vias, each one of said vias extending through said dielectric material between said conductive layer and one of said conductive strips, each of said conductive strips having at least one of said conductive vias.

2. The waveguide wall of claim 1, wherein said plurality of conductive strips have a uniform width and a uniform gap between adjacent strips.

3. The waveguide wall of claim 1, wherein said plurality of conductive strips present a high impedance surface to an electromagnetic wave having an E field thereof transverse to said conductive strips.

4. The waveguide wall of claim 1, wherein adjacent pairs of said plurality of conductive strips present a capacitance and the combination of said dielectric sheet and said conductive vias presents an inductance to an electromagnetic wave with an E field thereof transverse to said conductive strips.

5. The waveguide wall of claim 1, wherein said conductive strips and dielectric material realize a series of equivalent L-C circuits to an electromagnetic wave with an E field thereof transverse to said conductive strips.

6. The waveguide wall of claim 1, wherein said sheet of dielectric material comprises one of plastic, poly-vinyl carbonate (PVC), ceramic and high resistant semiconductor material.

7. The waveguide wall of claim 1, wherein said sheet of dielectric material comprises gallium arsenide (GaAs) and is 10 mils thick.

8. The waveguide wall of claim 1, wherein said conductive layer, plurality of conductive strips and plurality of vias respectively comprise either a highly conductive metal or combination of highly conductive metals.

9. The waveguide wall of claim 1, wherein said conductive layer and said plurality of conductive strips are respectively 2 microns thick and comprise gold, each said conductive strips being 16 mils wide and having a 1.5 mil gap between adjacent strips.

10. The waveguide wall of claim 1, wherein said plurality of vias each have a 5 mil by 5 mil cross section, said plurality of vias each having interior walls covered with a layer of gold.

11. A rectangular waveguide for transmitting an electromagnetic signal, comprising:

a rectangular waveguide having four wall surfaces comprising two opposing sidewalls, a top wall and bottom wall; and a respective wall structure on at least two of said four wall surfaces of said waveguide, said respective wall structure presenting a high impedance to an E field transverse to an axis of the waveguide and parallel to the wall structure, and a low impedance parallel to the waveguide axis.

12. The waveguide of claim 11, further comprising an electromagnetic signal source at one end of said waveguide arranged to direct the electromagnetic signal into said waveguide with an E field thereof transverse to the waveguide's longitudinal axis.

13. The waveguide of claim 12, further comprising an amplifier mounted at the opposite end of the waveguide to amplify the electromagnetic signals transmitted through the waveguide from said signal source.

14. The waveguide of claim 13, wherein said amplifier is an amplifier array.

15. The waveguide of claim 11, for an electromagnetic signal having horizontal polarization, said respective wall structures provided on the two opposing sidewalls of said waveguide.

16. A rectangular waveguide for transmitting an electromagnetic signal, comprising:

a rectangular waveguide having; four walls surfaces comprising two opposing sidewalls, a top wall and bottom wall; and a respective wall structure on at least two of said four wall surfaces of said waveguide, said respective wall structure presenting a high impedance to an E field transverse to an axis of the waveguide and parallel to the wall structure, and a low impedance parallel to the waveguide axis, said waveguide transmitting the electromagnetic signal having vertical polarization, said respective wall structures provided on top and bottom walls of said waveguide.

17. A rectangular waveguide for transmitting an electromagnetic signal, comprising:

a rectangular waveguide having four wall surfaces comprising two opposing sidewalls, a top wall and bottom wall; and a respective-wall structure on at least two of said four wall surfaces of said waveguide, said respective wall structure presenting a high impedance to an E field transverse to an axis of the waveguide and parallel to the wall structure, and a low impedance parallel to the waveguide axis, said waveguide transmitting the electromagnetic signal having, vertical and horizontal polarization, said respective wall structures provided on all four walls of said waveguide.

18. A rectangular waveguide for transmitting an electromagnetic signal, comprising:

a rectangular waveguide having four wall surfaces comprising two opposing sidewalls and a top and bottom wall; and a respective wall structure on at least two of said four wall surfaces of said waveguide, said respective wall structure presenting a high impedance to an E field transverse to an axis of the waveguide and parallel to said respective wall structure, and a low impedance parallel to the waveguide axis, wherein said wall structure comprises:

a sheet of dielectric material having two sides;

a conductive layer on one 'side of the two sides of said dielectric material;

a plurality of mutually spaced parallel conductive strips on the other side of the two sides of said dielectric material; and a plurality of conductive vias, each of said vias extending through said dielectric material between said conductive layer and one of said conductive strips.

19. The waveguide, of claim 18, wherein said plurality of conductive strips have a uniform width and a uniform gap between adjacent strips.

20. The waveguide of claim 18, wherein said plurality of conductive strips present a high impedance surface to an electro-magnetic wave having an E field thereof transverse to said conductive strips.

21. The waveguide of claim 18, wherein adjacent pairs of said strips present a capacitance and, the combination of said dielectric sheet and said conductive vias presents an inductance to an electromagnetic wave with an E field thereof transverse to said plurality of conductive strips.

22. The waveguide of claim 18, wherein said conductive strips and dielectric material realize a series of equivalent L-C circuits to an electromagnetic wave with an E field thereof transverse to said conductive strips.

23. The waveguide of claim 18, wherein said sheet of dielectric material comprises one of plastic, poly-vinyl carbonate (PVC) ceramic and high resistant semiconductor material.

24. The waveguide of claim 18, wherein said sheet of dielectric material comprises gallium arsenide (GaAs) and is 10 mils thick.

25. The waveguide of claim 18, wherein said conductive layer, plurality of conductive strips and plurality of vias respectively comprise either a metal or combination of metals.

26. The waveguide of claim 18, wherein said conductive layer and said plurality of conductive strips are respectively 2 microns thick and comprise gold, each said conductive strips being 16 mils wide and having a 1.5 mil gap between adjacent strips.

27. The waveguide of claim 18, wherein said plurality of vias each have a 5 mil by 5 mil cross section, said plurality of vias each having interior walls covered with a layer of gold.

28. An electro-magnetic signal amplifier, comprising:

a waveguide input section having a rectangular cross section and four walls, further having a respective high impedance wall structure on two opposing walls of said four walls;

a waveguide amplifier section having a rectangular cross section and four walls, further having a amplifier array mounted midway through said amplifier section and a respective high impedance wall structure on said four walls of said amplifier section; and a waveguide output section having a rectangular cross-section and four walls, further having a respective high impedance wall structure on two opposing walls of said four walls of said output section.

29. The amplifier of claim 28, wherein said four walls of said input section comprise two sidewalls and a top wall and a bottom wall, said respective high impedance wall structure mounted on said sidewalls.

30. An electro-magnetic signal amplifier, comprising:

a waveguide input section having a rectangular cross section and four walls, further having a respective high impedance wall structure on two opposing walls of said four walls;

a waveguide amplifier section having a rectangular cross section and four walls, further having an amplifier array mounted midway through said amplifier section and a respective high impedance wall structure on said four walls of said waveguide amplifier section; and a waveguide output section having a rectangular cross-section and four walls, further having a respective high impedance wall structure on two opposing walls of said four walls, wherein said four walls of said output section comprise two sidewalls, a top wall and a bottom wall, said respective high impedance wall structure mounted on said top and bottom walls of said output section.

31. An electromagnetic signal amplifier, comprising:

a waveguide input section having a rectangular cross section and four walls, further having a respective high impedance wall structure on two opposing walls of said four walls;

a waveguide amplifier section having a rectangular cross section and four walls, further having a amplifier array mounted midway through said amplifier section and a respective high impedance wall structure on said four walls of said amplifier section; and a waveguide output section having a rectangular cross-section and four walls, further having a respective high impedance wall structure on two opposing walls of said four walls of said output section, wherein said amplifier section further comprises two matching polarizers, a respective matching polarizer mounted on each side of said amplifier array.

32. An electromagnetic signal amplifier, comprising:

a waveguide input section having a rectangular cross section and four walls, further having a respective high impedance wall structure on two opposing walls of said four walls;

a waveguide amplifier section having a rectangular cross section and four walls, further having a amplifier array mounted midway through said amplifier section and a respective high impedance wall structure on said four walls of said amplifier section; and a waveguide output section having a rectangular cross-section and four walls, further having a respective high impedance wall structure on two opposing walls of said four walls of said output section, wherein said wall structure presents a high impedance to E fields transverse to the longitudinal axis of the waveguide and a low impedance parallel to the longitudinal axis of the waveguide.

33. An electro-magnetic signal amplifier, comprising:

a waveguide input section having a rectangular cross section and four walls, further having a respective high impedance wall structure on two opposing walls of said four walls of said waveguide input section;

a waveguide amplifier section having a rectangular cross section and four walls, further having a amplifier array mounted midway through said amplifier section and a respective high impedance wall structure on said four walls of said waveguide amplifier section; and a waveguide output section having a rectangular cross-section and four walls, further having a respective high impedance wall structure on two opposing wall of said four walls of said output section, wherein said wall structures respectively comprise:

a sheet of dielectric material having two sides;

a conductive layer on one side of the two sides of said dielectric material;

a plurality of mutually spaced parallel conductive strips on the other side of the two sides of said dielectric material; and a plurality of conductive vias, each of said vias extending through said dielectric material between said conductive layer and one of said conductive strips.

34. The amplifier of claim 33, wherein said plurality of conductive strips have a uniform width and a uniform gap between adjacent strips.

35. The amplifier of claim 33, wherein said plurality of conductive strips present a high impedance surface to an electro-magnetic wave having an E field thereof transverse to said conductive strips.

36. The amplifier of claim 33, wherein adjacent pairs of said strips present a capacitance and the combination of said dielectric sheet and said conductive vias presents an inductance to an electromagnetic wave with an E field thereof transverse to said plurality of conductive strips.

37. The amplifier of claim 33, wherein said conductive strips and dielectric material realize a series of equivalent L-C circuits to an electro-magnetic wave with an E field thereof transverse to said conductive strips.

38. The amplifier of claim 33, wherein said sheet of dielectric material comprises one of plastic, poly-vinyl carbonate (PVC), ceramic and high resistant semiconductor material.

39. The amplifier of claim 33, wherein said sheet of dielectric material comprises gallium arsenide (GaAs) and is 10 mils thick.

40. The amplifier of claim 33, wherein said conductive layer, plurality of conductive strips and plurality of vias respectively comprise either a metal or combination of metals.

41. The amplifier of claim 33, wherein said conductive layer and said plurality of conductive strips are respectively 2 microns thick and comprise gold, each said conductive strips being 16 mils wide and having a 1.5 mil gap between adjacent strips.

42. The amplifier of claim 33, wherein said vias have a 5 mil by 5 mil cross section, the interior walls of said vias covered with a layer of gold.

* * * * *

UNITED STATES PATENT AND TRADEMARK OFFICE

CERTIFICATE OF CORRECTION

PATENT NO. : 6,603,357 B1
APPLICATION NO. : 09/408992
DATED : August 5, 2003

INVENTOR(S) : John A. Higgins, Moonil Kim and Jonathan Bruce Hacker

It is certified that error appears in the above-identified patent and that said Letters Patent is hereby corrected as shown below:

In column 1, line 6 (following the title and preceding the heading "Background"), the following government rights statement should be inserted:

-- This invention was made with Government support promoted by the Defense Advanced Research Projects Office (DARPA) in association with the U.S. Department of Navy, Space and Naval Warfare Systems Command (SPAWAR), under contract N66001-96-C-8627. The Government has certain rights in this invention. --

Signed and Sealed this

Twentieth Day of January, 2009

JON W. DUDAS
*Director of the United States Patent and Trademark Office*